United States Patent
Sugimoto

(10) Patent No.: US 8,872,585 B2
(45) Date of Patent: Oct. 28, 2014

(54) AMPLIFIER FOR RECEIVING OPTICAL SIGNALS COMPLEMENTARY TO EACH OTHER

(71) Applicant: Sumitomo Electric Industries, Ltd., Osaka (JP)

(72) Inventor: Yoshiyuki Sugimoto, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 120 days.

(21) Appl. No.: 13/631,232

(22) Filed: Sep. 28, 2012

(65) Prior Publication Data

US 2013/0082776 A1  Apr. 4, 2013

(30) Foreign Application Priority Data

Sep. 30, 2011  (JP) ................................. 2011-217748

(51) Int. Cl.
  *H03F 3/45*  (2006.01)
  *H03G 3/30*  (2006.01)
  *H03F 1/08*  (2006.01)
  *H03F 3/08*  (2006.01)

(52) U.S. Cl.
  CPC .. *H03F 3/45968* (2013.01); *H03F 2203/45212* (2013.01); *H03G 3/3084* (2013.01); *H03F 1/083* (2013.01); *H03F 3/45* (2013.01); *H03F 2203/45138* (2013.01); *H03F 3/087* (2013.01); *H03F 3/45085* (2013.01); *H03F 2200/375* (2013.01)

USPC ........................... 330/252; 330/129; 330/254

(58) Field of Classification Search
  CPC ........................................................ H03F 3/45
  USPC ............................... 330/252, 308; 250/214 A
  See application file for complete search history.

(56) References Cited

U.S. PATENT DOCUMENTS

| 5,798,664 A | * | 8/1998 | Nagahori et al. ............. 327/307 |
| 5,875,049 A | * | 2/1999 | Asano et al. .................. 398/202 |
| 6,275,541 B1 | * | 8/2001 | Nagahori et al. ............. 375/318 |

FOREIGN PATENT DOCUMENTS

| JP | 07-240640 | 9/1995 |
| JP | 2003-168933 | 6/2003 |
| JP | 2003-264437 | 9/2003 |
| JP | 2010-278753 | 12/2010 |

* cited by examiner

*Primary Examiner* — Robert Pascal
*Assistant Examiner* — Khiem Nguyen
(74) *Attorney, Agent, or Firm* — Venable LLP; Michael A. Sartori; George L. Howarah

(57) ABSTRACT

An amplifier for detecting photocurrents complementary to each other is disclosed. The optical receiver includes two trans-impedance amplifiers (TIAs) each having the single phase arrangement, a level detector to detect an average level between respective outputs of the TIAs, a controller to detect a difference between each of the output of the TIA, and an offset canceller to bypass each of the photocurrents to compensate the output offset between two TIAs depending on the average level and the difference between two levels.

3 Claims, 6 Drawing Sheets

Prior Art

Prior Art

US 8,872,585 B2

AMPLIFIER FOR RECEIVING OPTICAL SIGNALS COMPLEMENTARY TO EACH OTHER

BACKGROUND OF THE INVENTION

1. Field of the Invention

The present invention relates to an amplifier to convert a pair of unbalanced currents into a balanced pair of voltages, in particular, the invention relates to an amplifier implemented with an optical receiver.

2. Related Background Arts

An optical receiver generally includes a light-receiving device such as photodiode (hereafter denoted as PD), and an amplifier to convert a photocurrent generated by the PD into a voltage signal. The amplifier generally has the configuration of, what is called, the trans-impedance amplifier (hereafter denoted as TIA) and some controllers to control the voltage signal, for instance, to adjust the output offset contained in the voltage signals when the PD and the amplifier have the differential arrangement.

The PD, when it senses an optical signal with high frequency components and large power, is necessary to be biased by an enough bias voltage. While, a continuous requests for electronic apparatus has been presented to reduce the power consumption and lower the supply voltage thereof, which contradicts the request to supply enough bias voltage to the PD. The present invention provides one of solutions to this inconsistent request.

SUMMARY OF THE INVENTION

An aspect of the present application relates to an amplifier that converts an unbalanced pair of input currents into a balanced pair of voltages. A feature of the present amplifier is that the amplifier includes a pre-amplifier to convert a portion of the input currents into the output voltages, wherein the pre-amplifier includes two trans-impedance amplifiers (TIAs) each having a single phase arrangement to receive respective portions of the input currents; a level detector that detects an average level between respective output voltages; a controller to amplify a difference between averages of respective output voltages, wherein the controller adjusts a gain thereof depending on the average level between the output voltages; and an offset canceller to bypass a rest of the input currents.

The amplifier of the embodiment may further include a main amplifier in the downstream of the pre-amplifier to amplify the output voltages of respective TIAs differentially to generate outputs of the amplifier. In this arrangement, the controller amplifies a difference between averages of each of the outputs of the main amplifiers instead of the output voltages of the TIAs. Still further, the level detector may detect an average level between the outputs of the main amplifier instead of the average level between the output voltages of the TIAs.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF PREFERRED EMBODIMENTS

A comparable example will be first described. An optical receiver applicable to a communication system of the Differential Quadrature Phase Shift Keying (DQPSK), Dual Polarization-Quadrature Phase Shift Keying (DP-QPSK), and so on generally provides an optical hybrid, which optically processes input optical signals, in an upstream stage of a photodiode (PD). Such an optical hybrid, which converts a phase modulated optical signal into an amplitude modulated optical signal, generates a pair of optical signals complementary to each other, Pin and /Pin, where a slash "/" accompanied in the front of a context means a signal denoted by the context except the slash with a negative phase. In order to maximize the signal-to-noise ratio of the converted optical signals, outputs of respective PDs are provided to a trans-impedance amplifier (TIA) 10 with the differential configuration shown in FIG. 1.

An optical receiver 100 includes a pair of PDs, $PD_1$ and $PD_2$, and TIA 10 whose differential inputs are coupled to respective PDs, while, two PDs, $PD_1$ and $PD_2$, are biased by a power supply Vcc. The PDs, $PD_1$ and $PD_2$, generate photocurrents with a differential mode, and the TIA 10 converts this differential photocurrents into voltage signals, Vout and /Vout, also with the differential mode. In the comparable example shown in FIG. 1, the output signals, Vout and /Vout, generally show an offset because of the uneven input optical signals, Pin and /Pin, due to a scattered performance of optical hybrid, that caused in the sensitivity of two PDs, $PD_1$ and $PD_2$, and so on.

On the other hand, adequate bias conditions are generally required to operate a PD stably in high speeds. In an arrangement shown in FIG. 1, the PDs are reversely biased by the power supply Vcc; accordingly, a condition that the power supply Vcc is set high and/or the input level of the TIA 10 is set low is necessary to provide an adequate reverse bias for the PD. The former condition, where the power supply Vcc is set high, is negated because of continuous requests to lower the power consumption of an electronic apparatus; then, the latter condition to set the input level of the TIA 10 low enough is rest and only the solution for the optical receiver 100.

Figure 1:
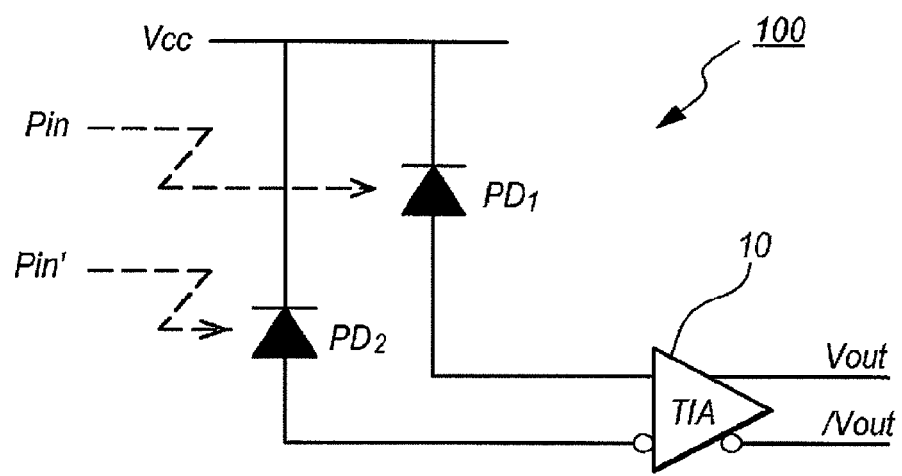
FIG. 1 is a circuit diagram of an optical receiver configured with a differential arrangement.
Figure 2:
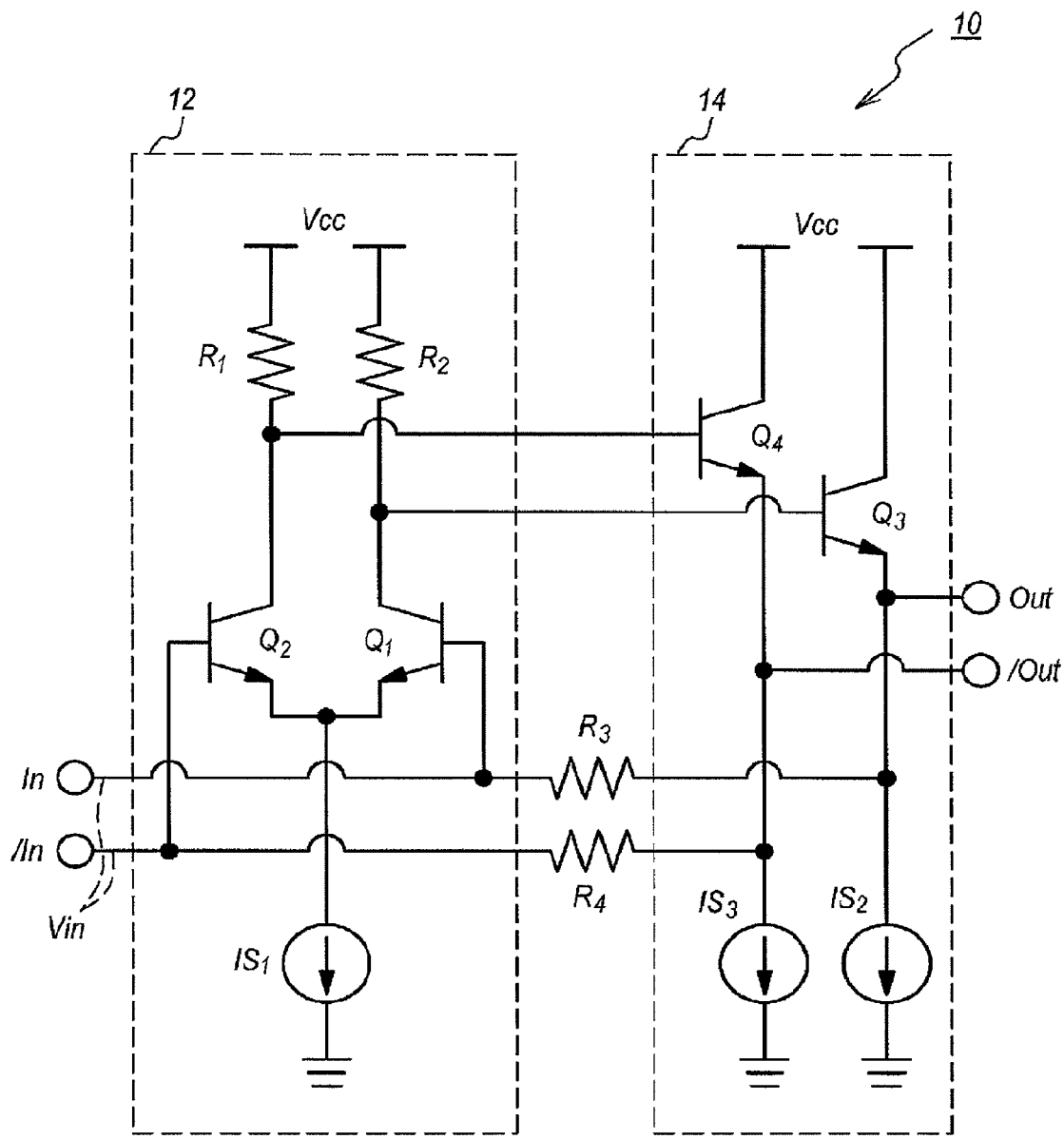
FIG. 2 is a circuit diagram of a TIA with the differential mode according to a comparable example of the present application.

FIG. 2 is a circuit diagram applicable to the comparable TIA 10 shown in FIG. 1. The TIA 10 includes a pair of input terminals, In and /In, a pair of output terminals, Out and /Out, a differential circuit 12 with an emitter follower 14 each put between the input terminals and the output terminals, and a pair of feedback resistors, $R_3$ and $R_4$. The input terminals, In and /In, receive the photocurrents, Iin and /Iin, each generated in the PDs, $PD_1$ and $PD_2$, while, the output terminals, Out and /Out, provide the output voltages, Vout and /Vout. The differential circuit 12 includes a pair of transistors, $Q_1$ and $Q_2$, a pair of resistors, $R_1$ and $R_2$, and a current source $IS_1$. The emitter follower 14 includes two transistors, $Q_3$ and $Q_4$, and two current sources, $IS_2$ and $IS_3$.

The input levels Vin of the TIA 10 at respective input terminals, In and /In, are determined by equation (1):

$$Vin = Vcc - (I_1/2) \times R_L - V_{BE} + Iin \times R_F,$$

where $I_1$, $R_L$, $V_{BE}$, and $R_F$ are the current by the current source $IS_1$, the resistance of the resistors, $R_1$ or $R_2$, the base-emitter voltage of the transistor $Q_3$ and $Q_4$, and the resistance of the feedback resistors, $R_3$ and $R_4$, respectively. From equation (1) above, the input level Vin may be lowered by adjusting the parameters, $I_1$, $R_L$, and $V_{BE}$. However, when the current source $IS_1$ is configured by a transistor, a substantial collector bias is necessary to operate the transistor in the constant current mode; and the input level Vin, which corresponds to the base level of the transistor, $Q_1$ or $Q_2$, becomes the collector level of the current source $IS_1$ added by the base-emitter bias that is the forward bias condition of the pn-junction and becomes about 0.8 V. Then, the input level Vin saturates around 1.5 V.

Figure 3:
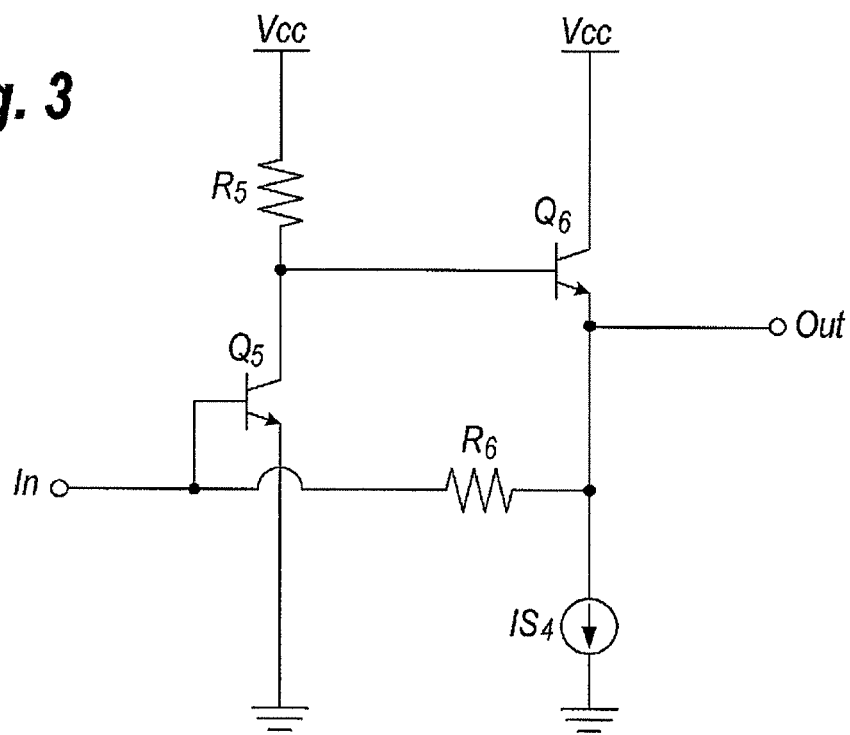
FIG. 3 is a circuit diagram of another TIA with the single phase arrangement.

Another arrangement of the optical receiver 100 provides two TIAs each operating in a single phase mode, which is shown in FIG. 3. The TIA shown in FIG. 3 includes two transistors, $Q_5$ and $Q_6$, two resistors, $R_5$ and $R_6$, and a current source $IS_4$. The TIA shown in FIG. 3 does not provide any current source in the amplifying stage configured by the transistor $Q_5$ and the resistor $R_5$; then the input level, the base level of the transistor $Q_5$ becomes equal to the base-emitter bias which is the forward bias condition of a pn-junction and becomes about 0.8 V. Thus, the TIA shown in FIG. 3 may lower the input level thereof about half of that of the differential TIA shown in FIG. 2.

However, when two TIAs each having the single phase arrangement are implemented in the optical receiver 100 and operated independently, a large offset is possibly caused between the outputs of respective TIAs because no differential circuits are put in the downstream of the PDs, $PD_1$ and $PD_2$. Moreover, the TIA with the single phase mode shown in FIG. 3 is generally lesser tolerance against a large input current. The input photocurrent applied in the input terminal In flows in the feedback resistor $R_6$ and into the current source $IS_4$, which reduces a current flowing in the transistor $Q_6$ and lowers the base-collector bias of the other transistor $Q_5$. Thus, the TIA with the single phase mode is necessary to compensate not only the offset appeared in two outputs of the optical receiver but to enhance the tolerance against a large input current.

Next, an optical receiver according to an embodiment of the present invention will be described as referring to FIGS. 4 and 5. The optical receiver of the invention is implemented with two TIAs each having the single phase arrangement.

The optical receiver 100A of the embodiment includes a pre-amplifier 21, a main amplifier 25, a buffer amplifier 27, a level detector 22, a controller 23 and an offset canceller 24, where each unit, 21 to 27, is put between two input terminals, In and /In, and two output terminals, Out and /Out. Two input terminals, In and /In, are connected to respective PDs, $PD_1$ and $PD_2$, and receive the photocurrents, Iin and /Iin. The photocurrents, Iin and /Iin, are unbalanced to each other but inherently includes an offset therebetween.

The pre-amplifier 21 includes two TIAs each having the single phase arrangement and receives a portion of the photocurrents, Ib and /Ib, which are bypassed from the photocurrents, Iin and /Iin, by respective cancelling currents, Icncl and /Icncl. The pre-amplifier 21 converts the bias currents, Ib and /Ib, into voltage signals, Vo and /Vo, while, the main amplifier 25 amplifies the voltage signals, Vo and /Vo, to amplified signals, Vout and /Vout.

The main amplifier 25, which may be a limiting amplifier, amplifies the voltage signals, Vo and /Vo, and provides two output signals, Vout and /Vout, not only to the output terminals, Out and /Out, but the buffer amplifier 27. The outputs, Vout and /Vout, are provided to the downstream unit that includes a data recovery and a clock recovery to recover data and clock contained in the output signals, Vout and /Vout.

The buffer amplifier 27, which is provided to isolate the controller 23 from the signal lines, generates offset signals, Voff and /Voff, to the controller 23. These offset signals, Voff and /Voff, which reflect the output signals, Vo and /Vo, provided by the pre-amplifier 21, are guided to the controller 23 via a low-pass filter including capacitors, $C_1$ and $C_2$. That is, the buffer amplifier 27 provides DC or low frequency (LF) components of the output signals, Vout and /Vout, which are substantially equal to averages of respective outputs, as the outputs, Voff and /Voff.

The level detector 22 detects an average between two outputs, Vo and /Vo, of the pre-amplifier 21 and outputs a detected signal Vave to the controller 23. The controller 23 generates control signals, Vctrl and /Vctrl, based on thus provided offset signals, Voff and /Voff, from the buffer amplifier 27 and the average signal Vave from the level detector 22. The offset canceller 24 bypasses the input currents, Iin and /Iin, by a magnitude determined by the control signals, Vctrl and /Vctrl. Then, the input bias currents, Ib and /Ib, for the pre-amplifier 21 are adjusted so as to cancel the offset contained therein by bypassing the cancel currents, Icncl and /Icncl, from the input photocurrents, Iin and /Iin, by feedbacking the offset appeared in the outputs, Vout and /Vout, of the optical receiver 100A and the average of the outputs of the pre-amplifier 21, Vo and /Vo.

Figure 4:
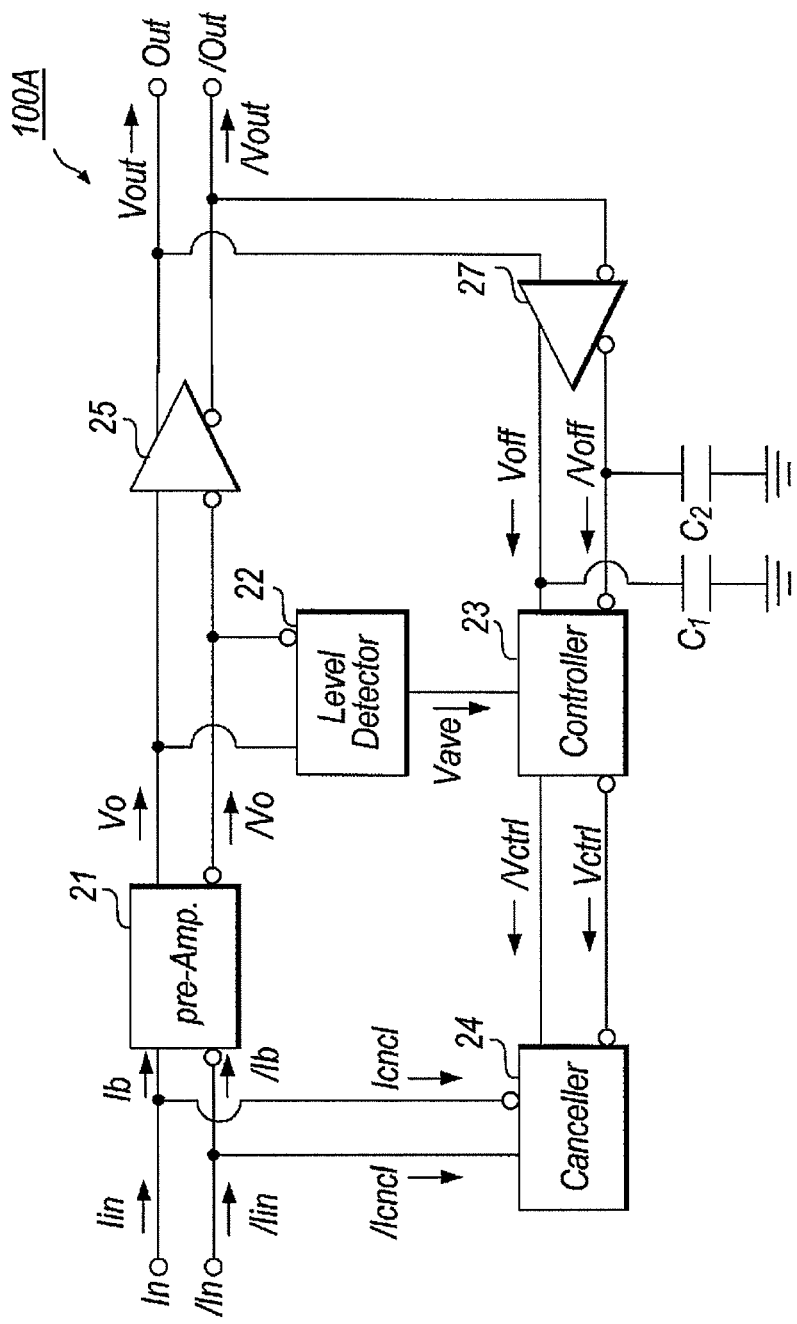
FIG. 4 is a functional block diagram of an optical receiver according to an embodiment of the present invention.
Figure 5:
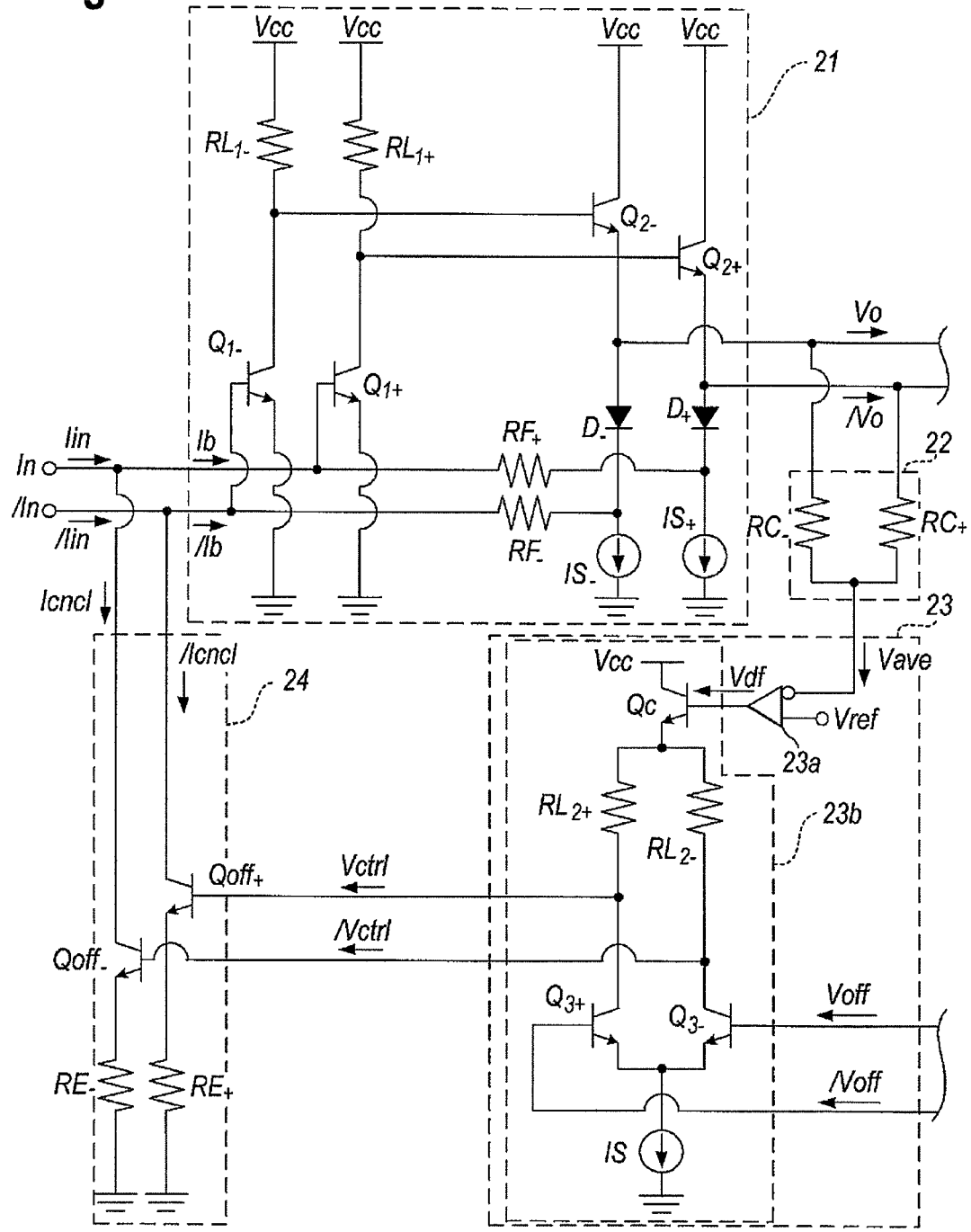
FIG. 5 is a circuit diagram of an amplifier implemented with the optical receiver shown in FIG. 4.

FIG. 5 shows an example of a specific circuit of the functional block diagram of the pre-amplifier 21, the level detector 22, the controller 23, and the offset canceller 24 each shown in FIG. 4. The pre-amplifier 21 includes two TIAs, the first TIA and the second TIA, each having the arrangement same as those shown in FIG. 3 and operating independently.

One of the cancel currents Icncl bypassed from the input photocurrent Iin flows into the offset canceller 24, while, a rest of the current Ib is guided into the first TIA, where this rest current Ib is converted into a voltage signal /Vo whose phase is opposite to that of the input photocurrent Iin and the bias current Ib. The first TIA includes two transistors, $Q_{1+}$ and $Q_{2+}$, a load resistor $RL_{1+}$, a feedback resistor $RF_+$, a diode $D_+$, and a current source $IS_+$. The transistor $Q_{1+}$ and the load resistor $RL_{1+}$ constitute an amplifying stage of the TIA with the emitter ground configuration, where the emitter of the transistor $Q_{1+}$ is directly grounded. The second transistor $Q_{2+}$, the diode $D_+$, and the current source $IS_+$ constitute the emitter follower, which lowers the level of the collector of the first transistor $Q_{1+}$ by a bias voltage corresponding to the forward bias conduction of two diodes, one of which is the diode $D_+$, while, the other is the base-emitter junction of the transistor $Q_{2+}$. The emitter follower, which couples the input terminal In with the input of the main amplifier 25 via the feedback resistor $RF_+$, outputs the voltage signal /Vo with a phase opposite to the input bias current Ib.

On the other hand, the other cancel current /Icncl bypassed from the photocurrent /Iin flows in the offset canceller 24, while the rest current /Ib is input in the second TIA. The second TIA converts thus input current /Ib into a voltage signal Vo with the phase concurrent with that of the input photocurrent Iin. The second TIA has the same arrangement with the first TIA, that is, the second TIA includes two transistors, $Q_{1-}$ and $Q_{2-}$, two resistors, $RL_{1-}$ and $RF_-$, a diode $D_-$ and a current source $IS_-$. These elements operate in a manner same as those in the first TIA. The first and second TIAs, compared with the TIA shown in FIG. 3, further include two diodes, $D_+$ and $D_-$, to raise the collector level, exactly, a bias between the collector and the base of the transistors, $Q_{1+}$ and $Q_{1-}$, in the amplifying stage.

The offset canceller 24 includes two transistors, $Qoff_+$ and $Qoff_-$, to bypass the input photocurrents, Iin and /Iin. Emitters of these transistors, $Qoff_+$ and $Qoff_-$, are grounded via respective emitter resistors, $RE_+$ and $RE_-$; while, bases receive the control signals, Vctrl and /Vctrl. Depending on the level of the control signals, Vctrl and /Vctrl, the transistors, $Qoff_+$ and $Qoff_-$, adjust the magnitude of the cancel currents, Icncl and /Icncl; then, the output offset between two voltage signals, Vo and /Vo, may be compensated.

The average detector 22 includes two resistors, $RC_+$ and $RC_-$, connected in series between respective outputs of the first and second TIAs. Because these two resistors, $RC_+$ and $RC_-$, have resistance same with the others, the intermediate node thereof may generate an average Vave of two outputs, Vo and /Vo. This average level Vave is led to the controller 23. The average detector 22 is not restricted to the arrangement shown in FIG. 5, another circuit, such as a digital processor to perform the average operation digitally, may be implemented within the optical receiver.

The controller 23 includes a comparator 23a, and a differential amplifier 23b. The comparator 23a receives the average level Vave from the level detector 22, compares this average level Vave with a reference Vref, and outputs a difference Vdf between them to control the power supply for the differential circuit 23b connected in the downstream of the comparator 23a. The comparator 23a may have an arrangement of an ordinary differential circuit such as those 23b presented in the downstream thereof. Specifically, the differential circuit 23b includes a pair of transistors, $Q_{3+}$ and $Q_{3-}$; a transistor Qc to control the power supplied to the differential pair of transistors, $Q_{3+}$ and $Q_{3-}$; a pair of load resistors, $RL_{2+}$ and $RL_{2-}$, and a current source IS commonly connected to the source of the paired transistors, $Q_{3+}$ and $Q_{3-}$.

The transistor Qc adjusts the bias supply provided to the differential pair of transistors, $Q_{3+}$ and $Q_{3-}$. Specifically, depending on the signal Vdf provided from the comparator 23a, the collector-emitter bias of the transistor Qc varies, which adjusts the power supply to the transistors, $Q_{3+}$ and $Q_{3-}$. Because the level detector 22, the comparator 23a, the differential circuit 23b, the offset canceller 24 and two TIAs constitute a feedback circuit, the average level of two output voltages, Vo and /Vo, may be adjusted to the reference Vref, or the power supply for the differentia circuit 23b is controlled such that the average level of two TIAs becomes equal to the reference Vref.

The bases of the differential pair of transistors, $Q_{3+}$ and $Q_{3-}$, receive the outputs, Voff and /Voff, of the buffer amplifier 27, which are the DC or LF components of the outputs, Vout and /Vout, of the main amplifier 25. The differential amplifier 23b amplifies the difference between the outputs, Voff and /Voff, to generate the control signals, Vctrl and /Vctrl, provided to the offset canceller 24 by reversing the phase thereof. Specifically, when one of the offset signals Voff in the DC level thereof exceeds the other of the offset signals /Voff, namely Voff>/Voff, then the control signal /Vctrl becomes less than the other control signal Vctrl, which bypasses the cancel current Icncl smaller compared to the other cancel current /Icncl and the bias current Ib becomes larger while the other bias current /Ib smaller, then the output Vo becomes lowers while the other output /Vo becomes larger. Thus, the feedback control of the offset appeared between the outputs of the main amplifier 25 is compensated.

Although the embodiment shown in FIG. 5 provides the emitter resistors, $RE_+$ and $RE_-$, in the offset canceller 24, a level shift unit such as an emitter follower provided in the pre-amplifier 21 may be implemented. The transistor Qc to adjust the power supply for the differential circuit 23b controls the average level of the control signals, Vctrl and /Vctrl. Accordingly, the controller 23 varies two outputs, Vctrl and /Vctrl, thereof in a direction same to each other, that is, the control signals, Vctrl and /Vctrl, are concurrently increased or decreased.

Figure 6:
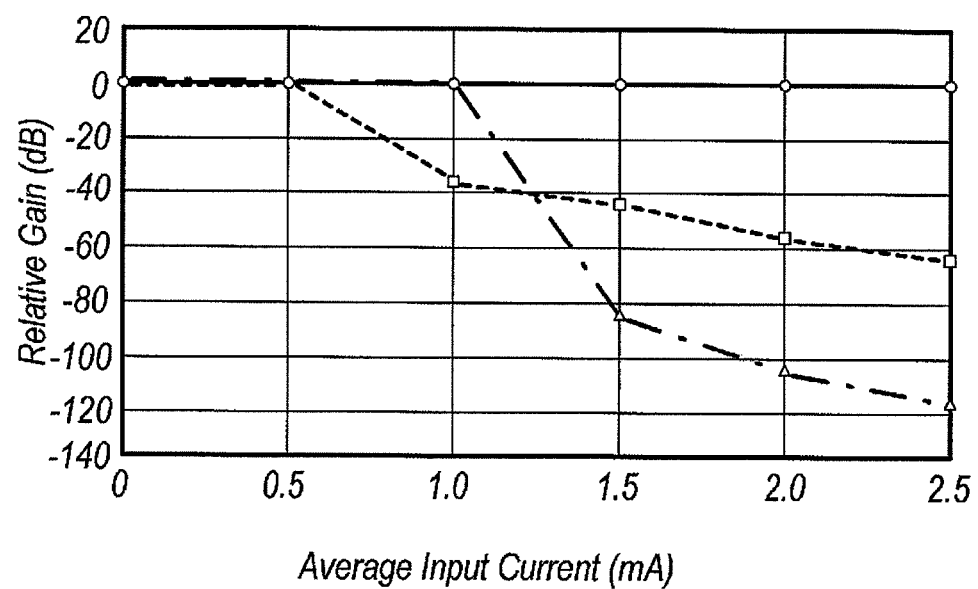
FIG. 6 compares the relative gain between two outputs complementary to each other of the embodiment shown in FIGS. 4 and 5 with comparable examples shown in FIGS. 2 and 3.

FIG. 6 shows behaviors of relative gains of the optical receiver according to the present embodiment shown in FIGS. 4 and 5, where the relative gain means a difference between the gain for the positive phase signal and that for the negative phase signal. FIG. 6 assumes that the photocurrents input therein contain ±10% offset with respect to the average thereof. For instance, when the average of the photocurrent is 1.0 mA, one of them is 0.9 mA while the other is 1.1 mA. Furthermore, the relative gains are measured from a case when the input photocurrent is 0 mA, which equivalently has no offset. In FIG. 6, the behavior denoted by open triangles corresponds to a case where the optical receiver implements with two TIAs each having the arrangement shown in FIG. 3 but eliminates the output level adjustment, another behavior denoted by open squares corresponds to a case where the optical receiver implements with the TIA of the differential arrangement shown in FIG. 2 but eliminates the function of the offset adjustment, and the behavior denoted by open circles assumes a case where two control of the level control by the level detector 22 and the offset control for two outputs, Voff and /Voff, are recovered.

As the average input current increases, the comparable example shown in FIG. 2, which corresponds to the behavior denoted by open squares, gradually decreases the relative gain thereof due to the reduction of the collector bias of the amplifier stage. Another comparable example denoted by open triangles also lowers the relative gain thereof by the reduction of the collector bias of the transistors, $Q_{1+}$ and $Q_{1-}$, because of no average level compensation by the level detector 22. On the other hand, the behavior denoted by open circles shows no reduction of the relative gain even when the input current increases to 2.5 mA.

Thus, the optical receiver according to an embodiment of the invention, the output offset is compensated by the level detector 22 and the controller 23 even when the pre-amplifier configures with two TIAs each configured with the single phase arrangement. The embodiment compensates the output offset thereof based on the final output thereof; however, the output offset may be compensated based on the output of the intermediate output, namely, the output of two TIAs.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed:

1. An amplifier configured to convert an unbalanced pair of input currents into a balanced pair of output voltages, comprising:

a pre-amplifier configured to covert a portion of the input currents into output voltages, the pre-amplifier including two trans-impedance amplifiers (TIAs) each having a single phase arrangement to receive respective portions of the input currents;
a level detector configured to detect an average level between the output voltages;
a controller configured to amplify a difference between averages of each of the output voltages; and
an offset canceller configured to bypass a rest of the input currents,
wherein the controller adjusts a gain thereof depending on the average level between the output voltages,
wherein the controller includes a differential circuit to amplify the difference between the average of each of the output voltages, and
wherein the level detector controls a power supply provided to the differential circuit to vary the gain of the differential circuit.

2. The amplifier of claim 1,
wherein the controller further includes a comparator and a transistor, the comparator comparing the average level output from the level detector with a reference, the transistor adjusting the power supply provided to the differential circuit by receiving an output of the comparator.

3. An amplifier configured to convert an unbalanced pair of input currents into a balanced pair of output voltages, comprising:

a pre-amplifier configured to covert a portion of the input currents into output voltages, the pre-amplifier including two trans-impedance amplifiers (TIAs) each having a single phase arrangement to receive respective portions of the input currents;
a level detector configured to detect an average level between the output voltages;
a controller configured to amplify a difference between averages of each of the output voltages; and
an offset canceller configured to bypass a rest of the input currents,
wherein the controller adjusts a gain thereof depending on the average level between the output voltages,
wherein each of the TIAs includes an amplifying stage, an emitter follower stage, and a feedback resistor, the amplifying stage including a transistor and a load resistor, the transistor being configured with an emitter ground arrangement whose emitter is directly grounded, the emitter follower stage receiving an output of the amplifying stage, the feedback resistor being put between the amplifying stage and the emitter follower stage.

* * * * *